(12) United States Patent
Matsumoto et al.

(10) Patent No.: US 8,432,348 B2
(45) Date of Patent: Apr. 30, 2013

(54) DATA SIGNAL LOADING CIRCUIT, DISPLAY PANEL DRIVING CIRCUIT, AND IMAGE DISPLAY APPARATUS

(75) Inventors: Kazuya Matsumoto, Kyoto (JP); Yasuyuki Doi, Kyoto (JP)

(73) Assignee: Panasonic Corporation, Osaka (JP)

( * ) Notice: Subject to any disclaimer, the term of this patent is extended or adjusted under 35 U.S.C. 154(b) by 792 days.

(21) Appl. No.: 12/536,866

(22) Filed: Aug. 6, 2009

(65) Prior Publication Data

US 2010/0039426 A1 Feb. 18, 2010

(30) Foreign Application Priority Data

Aug. 18, 2008 (JP) .................................. 2008-209651

(51) Int. Cl.
*G09G 3/36* (2006.01)
(52) U.S. Cl.
USPC ............................................................ 345/98
(58) Field of Classification Search .............. 345/98.214, 345/98, 100, 214
See application file for complete search history.

(56) References Cited

U.S. PATENT DOCUMENTS

| | | | |
|---|---|---|---|
| 5,091,701 A | 2/1992 | Butler | |
| 6,037,891 A * | 3/2000 | Griph ............................ | 341/161 |
| 7,405,732 B2 | 7/2008 | Kinjo et al. | |
| 7,479,941 B2 * | 1/2009 | Matsumoto et al. ............. | 345/98 |
| 8,094,104 B2 * | 1/2012 | Kinjo et al. ...................... | 345/87 |
| 2004/0207434 A1 | 10/2004 | Miura | |
| 2005/0146493 A1 | 7/2005 | Kinjo et al. | |
| 2005/0168602 A1 | 8/2005 | Sumi et al. | |
| 2006/0055653 A1 | 3/2006 | Matsumoto et al. | |
| 2006/0072044 A1 | 4/2006 | Kawamura et al. | |
| 2007/0279357 A1 | 12/2007 | Kinjo et al. | |
| 2007/0279358 A1 | 12/2007 | Kinjo et al. | |
| 2007/0279404 A1 | 12/2007 | Kinjo et al. | |

FOREIGN PATENT DOCUMENTS

| | | |
|---|---|---|
| CN | 1479913 A | 3/2004 |
| CN | 1645918 A | 7/2005 |
| CN | 1750071 A | 3/2006 |
| JP | 3833064 | 7/2006 |
| JP | 3833064 B2 | 10/2006 |
| JP | 2009-109953 | 5/2009 |
| WO | 02/47063 | 6/2002 |

OTHER PUBLICATIONS

English language Abstract of JP 2002-176350, Jun. 21, 2002.

(Continued)

*Primary Examiner* — Chanh Nguyen
*Assistant Examiner* — Tsegaye Seyoum
(74) *Attorney, Agent, or Firm* — Greenblum & Bernstein, P.L.C.

(57) ABSTRACT

A data signal loading circuit (i) which includes: a comparator CMP1 receiving clock signal CKP and reverse-phase signal CKN of clock signal CKP, and outputting clock signal CLP1 which is in phase with clock signal CKP, and clock signal CLN 1 having a reverse phase of clock signal CKP; a comparator CMP 2 having a non-inverting input terminal receiving clock signal CLP1, and an inverting input terminal receiving clock signal CLN1; and a comparator CMP3 having an inverting input terminal receiving clock signal CLP 1, and a non-inverting input terminal receiving clock signal CLN 1, and (ii) which, by using output signals CL1 and CL2 of the comparator CMP2 and the comparator CMP3 as clock signals for latch circuits L1 and L2, equalizes delay times for the rise or fall of clock signals CL1 and CL2 inputted to the latch circuits L1 and L2, and (iii) has low power consumption.

15 Claims, 12 Drawing Sheets

OTHER PUBLICATIONS

"LF155/LF156/LF256/LF257/LF355/LF356/LF357 JFET Input Operational Amplifiers", National Semiconductor Corporation, Dec. 2001, pp. 1-23.

Chinese Office Action for the corresponding Chinese Patent Application No. 200910165899.1, mail date is Jun. 26, 2012.
Japan Office action, mail date is Aug. 28, 2012.

* cited by examiner

DATA SIGNAL LOADING CIRCUIT, DISPLAY PANEL DRIVING CIRCUIT, AND IMAGE DISPLAY APPARATUS

BACKGROUND OF THE INVENTION (1) Field of the Invention

The present invention relates to a data signal loading circuit for performing high-speed signal transmission and high-speed data signal loading, a display panel driving circuit and an image display apparatus equipped with the data signal loading circuit, and particularly to technology that is useful for a driver which drives a liquid crystal panel.

(2) Description of the Related Art

As shown in FIG. 7, a conventional data signal loading circuit 100 includes: a latch circuit L1 (i) in which small-amplitude differential clock signals CKP and CKN are inputted to a non-inverting input terminal and an inverting input terminal of a comparator CMP1, respectively, and small-amplitude differential data signals DAP and DAN are inputted to a non-inverting input terminal and an inverting input terminal of a comparator CMP2, respectively, and (ii) which loads a data signal DL1 outputted from the comparator CMP2, at the rise of a clock signal CL1 outputted from the comparator CMP1; and a latch circuit L2 which loads the data signal DL1 at the rise of a clock signal CL2 outputted from an inverter circuit INV1 which generates a reverse-phase signal of the clock signal CL1 outputted from the comparator CMP1.

The configuration in FIG. 7 enables the data signal DL1 to be loaded synchronously with the rise of the small-amplitude differential clock signals CKP and CKN.

As shown in FIG. 9, a conventional data signal loading circuit 200 includes: a latch circuit L1 (i) in which small-amplitude differential clock signals CKP and CKN are inputted to a non-inverting input terminal and an inverting input terminal of a comparator CMP1, respectively, and the small-amplitude differential clock signals CKP and CKN are inputted to an inverting input terminal and a non-inverting input terminal of a comparator CMP2, respectively, and small-amplitude differential data signals DAP and DAN are connected to a non-inverting input terminal and an inverting input terminal of a comparator CMP3, respectively, and (ii) which loads a data signal DL1 outputted from the comparator CMP3, at the rise of a clock signal CL1 outputted from the comparator CMP1; and a latch circuit L2 which loads a data signal DL1 at the rise of a clock signal CL2 outputted from the comparator CMP2.

It should be noted that Japanese Patent No. 3833064 (Patent Reference 1), for example, is known as prior art document information of the invention in the present application.

According to the configuration of the conventional data signal loading circuit 100, the characteristics of the comparators CMP1 and CMP2 for amplifying the small-amplitude differential signals vary according to conditions such as frequency, power supply voltage, process, temperature. Thus, when the duty ratio between the clock signal CL1 and the data signal DL1 deviates significantly, there is a possibility that the latch circuit L1 and the latch circuit L2 will be unable to load the data signal DL1, and there is a possibility of causing misoperation particularly when the data signal loading circuit operates at high speed, and so on.

Hereinafter, the behavior of each signal in the conventional data signal loading circuit 100 shown in FIG. 7 shall be described using the timing chart in FIG. 8.

First, the rise and fall of the clock signal CL1 are outputted delayed from the rise and fall of the small-amplitude differential clock signal CKP inputted to the comparator CMP1, by a delay time T1 and a delay time T2, respectively. At this time, with the variation of the characteristics of the comparator CMP1 in response to conditions such as frequency, power supply voltage, process, and temperature, the delay time T1 and the delay time T2 do not become equal and the duty ratio between the high interval and the low interval of the clock signal CL1 deviates. Furthermore, the rise and fall of the clock signal CL2 are outputted delayed from the rise and fall of the clock signal CL1 inputted to the inverter INV1, by a delay time T3 and a delay time T4, respectively.

In the case of such a circuit configuration, it is predicted that a total delay time TS1 for the rise of the clock signal CL1 inputted to the latch circuit L1 becomes TS1=T1, and a total delay time TS2 for the rise of the clock signal CL2 inputted to the latch circuit L2 becomes TS2=T2+T3, and the total delay time TS1 and the total delay time TS2 will be significantly different.

In this manner, in the conventional data signal loading circuit 100, when the timing for both the rise and fall of the output signal of the comparator CMP1 is used in data signal loading, and the like, in an internal circuit of the data signal loading circuit 100, the inability to perform correct data signal loading arises, and it is assumed that this becomes more prominent as the operating speed of the data signal loading circuit 100 becomes higher.

In the structure of the conventional data signal loading circuit 200, the characteristics of the comparators CMP1, CMP2, and CMP3 for amplifying the small-amplitude differential signals vary according to conditions such as frequency, power supply voltage, process, temperature, in the same manner as in the data signal loading circuit 100. However, since the delay times for the rise of the clock signal CL1 and the clock signal CL2 outputted from the comparator CMP1 and the comparator CMP2, respectively, are approximately equal, it becomes easy to load the data signal DL1 synchronously with the rise of the small-amplitude clock signals CKP and CKN, compared to the data signal loading circuit 100.

Hereinafter, the behavior of each signal in the conventional data signal loading circuit 200 shown in FIG. 9 shall be described using the timing chart in FIG. 10.

First, the rise and fall of the clock signal CL1 are outputted delayed from the rise and fall of the small-amplitude differential clock signal CKP inputted to the comparator CMP1, by a delay time T1 and a delay time T2, respectively. The rise and fall of the clock signal CL2 are outputted delayed from the rise and fall of the small-amplitude differential clock signal CKN inputted to the comparator CMP2, by a delay time T3 and a delay time T4, respectively. At this time, when the comparator CMP1 and the comparator CMP2 have the same circuit configuration, the delay time T1 and delay time T3, and the delay time T2 and delay time T4 become approximately equal delay times. In addition, when the comparator CMP1 and the comparator CMP2 have the same circuit configuration according to conditions such as frequency, power supply voltage, process, and temperature, the duty ratio between the high interval and the low interval deviate in the same manner.

In the case of such a circuit configuration, a total delay time TS1 for the rise of the clock signal CL1 inputted to the latch circuit L1 becomes TS1=T1, and a total delay time TS2 for the rise of the clock signal CL2 inputted to the latch circuit L2 becomes TS2=T3, and the total delay time TS1 and the total delay time TS2 become approximately equal.

Next, FIG. 11 shows a circuit configuration diagram of the comparators CMP1, CMP2, and CMP3 which configured of transistors.

FIG. 11 shows a configuration in which the comparators are connected in multiple-stages.

The conventional comparators shown in FIG. 11 include, for example, a comparator C1, a comparator CS, and an inverter I1. The comparator C1 includes: a constant current source transistor MP1; transistors MP2 and MP3 to which the drain of MP1 is connected and a differential signal is inputted; and transistors MN1 and MN2 to which the drains of MP2 and MP3 are respectively connected. The comparator CS includes: transistors MN3 and MN4 to which the drains of MP2 and MP3 are respectively connected; a transistor MP4 having a gate and drain to which the drain of MN3 is connected; and a transistor MP5 having a gate to which the drain of MN3 is connected. The comparator CS outputs the drains of MP5 and MN4 to the inverter I1. The inverter I1 includes transistors MP6 and MN5 having gates to which the output signal of the comparator CS is inputted. The inverter I1 outputs the drains of MP6 and MN5, and has a function for shaping the output signal of the comparator CS.

When the comparators shown in FIG. 11 are applied to the comparators CMP1 to CMP3 of the conventional data signal loading circuit 200, there is concern over an increase in consumption current in the comparator CMP1 and the comparator CMP2 since these comparators are connected in multiple-stages. In addition, as shown in FIG. 12, when a configuration which connects the comparator C1 in two stages is assumed, as a comparator C2, in place of the comparator C1 shown in FIG. 11, consumption current increases further as the number of stages of the comparators increases. Furthermore, the load connected to the small-amplitude differential clock signals CKP and CKN are the comparator CMP1 and the comparator CMP2, and the load connected to the small-amplitude differential data signals DAP and DAN is only the comparator CMP3. As such, the small-amplitude differential data signals DAP and DAN become approximately half compared with the small-amplitude differential clock signals CKP and CKN, and there is the problem that the same impedance matching is not possible between the clock signals and the data signals.

SUMMARY OF THE INVENTION

The present invention is conceived in view of the aforementioned problems and has as an object to provide a data signal loading circuit having low power consumption and which can correctly load small-amplitude differential input signals even when the operating speed of the data signal loading circuit becomes high.

The data signal loading circuit according to a first aspect of the present invention includes: a first comparator which receives a clock signal and a reverse-phase signal of the clock signal, and outputs a second clock signal and a second reverse-phase signal, the second clock signal being in phase with the clock signal, and the second reverse-phase signal having a reverse phase of the clock signal; a second comparator having a non-inverting input terminal which receives the second clock signal and an inverting input terminal which receives the second reverse-phase signal; a third comparator having an inverting input terminal which receives the second clock signal and a non-inverting input terminal which receives the second reverse-phase signal; a fourth comparator which receives a data signal and a reverse-phase data signal having a reverse phase of the data signal, and which outputs a second data signal and a second reverse-phase data signal, the second data signal being in phase with the data signal, and the second reverse-phase data signal having a reverse phase of the data signal; a fifth comparator having a non-inverting input terminal which receives the second data signal and an inverting input terminal which receives the second reverse-phase data signal; a first latch circuit which loads a signal outputted from the fifth comparator, in accordance with a signal outputted from the second comparator; and a second latch circuit which loads the signal outputted from the fifth comparator, in accordance with a signal outputted from the third comparator.

According to such a configuration, even when the duty ratio between the low interval and the high interval of the output of the first or fourth comparator deviates in the clock for the first latch circuit and the second latch circuit, the deviations are approximately equal, and thus the data signal loading of the first and second latch circuits can be performed steadily and low power consumption can be realized since the number of the first comparators becomes half compared with that in the conventional configuration. In addition, the reduction in the number of constituent elements enables the suppression of characteristics variances between constituent elements such as random offset, and thus it becomes possible to perform reliable data signal loading in the first and second latch circuits.

Furthermore, it is preferable that the first comparator and the fourth comparator are fully-differential circuits.

With this configuration, the second clock signal which is in phase with the clock signal and the second reverse-phase signal having a reverse phase of the clock signal become approximately symmetrical signals, and since the delays can be matched, the data signal loading in the first and second latch circuits can be performed steadily.

Furthermore, it is preferable that the second comparator and the third comparator have the same circuit configuration.

With this configuration, the loads connected to the output signals of the first comparator can be made approximately equal, the second clock signal which is in phase with the clock signal and the second reverse-phase signal having the reverse phase of the clock signal become approximately perfectly-symmetrical signals, and since the delays can be matched, the data signal loading in the first and second latch circuits can be performed steadily.

Furthermore, it is preferable that the first latch circuit and the second latch circuit have the same circuit configuration and uniformly load the signal outputted from the fifth comparator, at a rise or a fall of the signal outputted from the second comparator and the signal outputted from the third comparator.

With this configuration, the first and second latch circuits can load, with approximately the same characteristics, the signal outputted from the fifth comparator.

Furthermore, it is preferable that voltage of the clock signal, the reverse-phase signal of the clock signal, the data signal, and the reverse-phase data signal is smaller than a potential difference between a power supply potential and a ground potential of the data signal loading circuit.

With this, the clock signal and the reverse-phase signal of the clock signal, and the data signal and the reverse-phase data signal having the reverse phase of the data signal become small-amplitude differential signals, and thus it becomes possible to realize low EMI (electromagnetic interference) and low power consumption compared to when signal voltage is made to oscillate between the power supply potential level and the ground potential level of the data signal loading circuit.

Furthermore, it is preferable that the first comparator and the fourth comparator have the same circuit configuration.

With this configuration, the respective loads connected to the clock signal and the reverse-phase signal of the clock signal, and the data signal and the reverse-phase data signal having the reverse phase of the data signal can all be made approximately equal, and thus facilitating signal impedance matching.

Furthermore, it is preferable that, in a data signal loading circuit according to a second aspect of the present invention, the first latch circuit includes a third latch circuit and a fourth latch circuit which load the signal outputted from the fifth comparator, the second latch circuit includes a fifth latch circuit and a sixth latch circuit which load the signal outputted from the fifth comparator, the data signal loading circuit further includes: a first flip-flop circuit which frequency-divides the signal outputted from the second comparator; and a second flip-flop circuit which frequency-divides the signal outputted from the third comparator, the third latch circuit loads the signal outputted from the fifth comparator, at a rise of a third clock signal outputted from the first flip-flop circuit, the fourth latch circuit loads the signal outputted from the fifth comparator, at a fall of the third clock signal, the fifth latch circuit loads the signal outputted from the fifth comparator, at a rise of a fourth clock signal outputted from the second flip-flop circuit, and the sixth latch circuit loads the signal outputted from the fifth comparator, at a fall of the fourth clock signal.

With this configuration, the operating cycle of the signals outputted from the third to sixth latch circuits become half of the operating cycle of the signals outputted from the first and second latch circuits, and thus, when it is desired to load an output signal from a latch circuit at a central timing in the operating cycle of the signal outputted from the latch circuit, timing margins, such as setup and hold, double as a result, and thus the operating frequencies of the clock signal and the reverse-phase signal of the clock signal, and the data signal and the reverse-phase data signal having the reverse phase of the data signal can be increased, and thus enabling high-speed operation.

Furthermore, a data signal loading circuit according to a third aspect of the present invention may include: a sixth comparator which receives the second clock signal and the second reverse-phase signal outputted from the first comparator, and which outputs a fifth clock signal which is in phase with the second clock signal and a fifth reverse-phase signal having a reverse phase of the second clock signal; a second comparator having a non-inverting input terminal which receives the fifth clock signal and an inverting input terminal which receives the fifth reverse-phase signal; a third comparator having an inverting input terminal which receives the fifth clock signal and a non-inverting input terminal which receives the fifth reverse-phase signal.

In this manner, high-speed operation becomes possible by connecting comparators in multiple stages, and low power consumption can be realized by inputting, to the second and third comparators, the output of the comparator connected as the final-stage connected in the multiple-stages.

Furthermore, in order to match delay times with the clock signal, it is preferable to connect comparators in multiple stages between the fourth and fifth comparators, or to provide a delay adjustment circuit to the output of the fifth comparator.

Furthermore, it is preferable that the clock signal and the reverse-phase signal of the clock signal are inputted to the first comparator via a signal quality adjustment circuit, and the data signal and the reverse-phase data signal are inputted to the fourth comparator via a signal quality adjustment circuit.

The signal quality adjustment circuit is intended for shaping signal waveforms, such as impedance matching, and by shaping the signal waveform, reliable signal transmission and high-speed operation of the data signal loading circuit become possible, and suppression of unnecessary radiation also becomes possible Furthermore, the display panel driving circuit according to an aspect of the present invention includes: the data signal loading circuit according to claim 1, which receives a display data signal and a clock signal, and loads the display data signal; a shift register which generates a latch signal for sequentially loading display data signals outputted from the data signal loading circuit; and a digital-to-analog (D-A) conversion circuit which converts a digital signal outputted from the data signal loading circuit into an analog signal.

With this configuration, as described above, a display panel driving circuit which allows highly-reliable transmission at high-speed and with low power consumption is realized.

Furthermore, in the display panel driving circuit according to an aspect of the present invention, a power supply potential supplied to the first to fifth comparators may be different from a power supply potential supplied to other than the first to fifth comparators.

With this configuration, it is possible to improve characteristics by raising only the power supply potential supplied to the comparators, and to lower power consumption by lowering voltage supplied to other circuits for which operation at high speed is not required, with respect to the reduction in the operating range of comparators due to the lowering of voltage in recent years, and to the deterioration of high-speed operation characteristics due to the deterioration of the current capability of constituent elements. Furthermore, when high-speed operation is not required, the power supply voltage to the comparators can also be lowered in order to reduce unnecessary consumption current.

Furthermore, in the display panel driving circuit according to an aspect of the present invention, a power supply potential supplied to the first to fifth comparators and the first and second latch circuits may be different from a power supply potential supplied to other than the first to fifth comparators and the first and second latch circuits.

Generally, with a circuit that uses a constituent element such as a semiconductor, current capability deteriorates and data signal loading capability is reduced as voltage becomes lower, and thus high-speed operation characteristics deteriorates. Accordingly, by raising the power supply potential supplied to latch circuits, characteristics enhancement becomes possible and thus high-speed operation becomes possible.

Furthermore, in the display panel driving circuit according to an aspect of the present invention, a power supply potential supplied to the first to fifth comparators, the first and second flip-flop circuits, and the first and second latch circuits may be different from a power supply potential supplied to other than the first to fifth comparators, the first and second flip-flop circuits, and the first and second latch circuits.

The advantageous effect here obvious, and there is the same advantageous effect as described previously.

Furthermore, an image display apparatus according to an aspect of the present invention includes: a display panel including image display elements; the display panel driving circuit according to claim 9, for driving the display panel; and a control circuit for controlling the display panel driving circuit.

With this configuration, since high-speed operation is possible, high-resolution and larger screens become possible, and it is possible to realize a stable image display apparatus which does not impart unpleasantness, such as flickering, to a viewer of images.

Furthermore, it is preferable that, in the image display apparatus according to an aspect of the present invention, the display panel is a liquid crystal display panel.

High-definition, large screens, and low power consumption are highly demanded from the latest liquid crystal display panels, and thus the speeding-up of data signal loading circuits is required in order to satisfy such requirements. Providing the display panel driving circuit of the present invention to an image display apparatus allows such requirements to be satisfied.

Furthermore, it is preferable that, in the image display apparatus according to an aspect of the present invention, the display panel, the display panel driving circuits, and the control circuit are integrally formed on the same substrate.

With this configuration, the number of components used in the image display apparatus can be reduced and thus cost reduction becomes possible, and since the number of components used in the image display apparatus can be reduced, a reliable image display apparatus can be realized.

According to the data signal loading circuit, the display panel driving circuit, and the image display apparatus of the present invention, even when there is a deviation in the duty ratio between the high interval and the low interval in the outputs of comparators which receive differential signals, in a data signal loading circuit which operates by receiving small-amplitude differential signals as clock signals, the deviations in duty ratios in the clock signals inputted to the latch circuits can be approximately equalized, and thus it becomes possible to perform stable data signal loading, and reduce power consumption.

Further Information about Technical Background To this Application

The disclosure of Japanese Patent Application No. 2008-209651 filed on Aug. 18, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The preferred embodiments of the present invention shall be described using the Drawings.

First Embodiment

Figure 1:
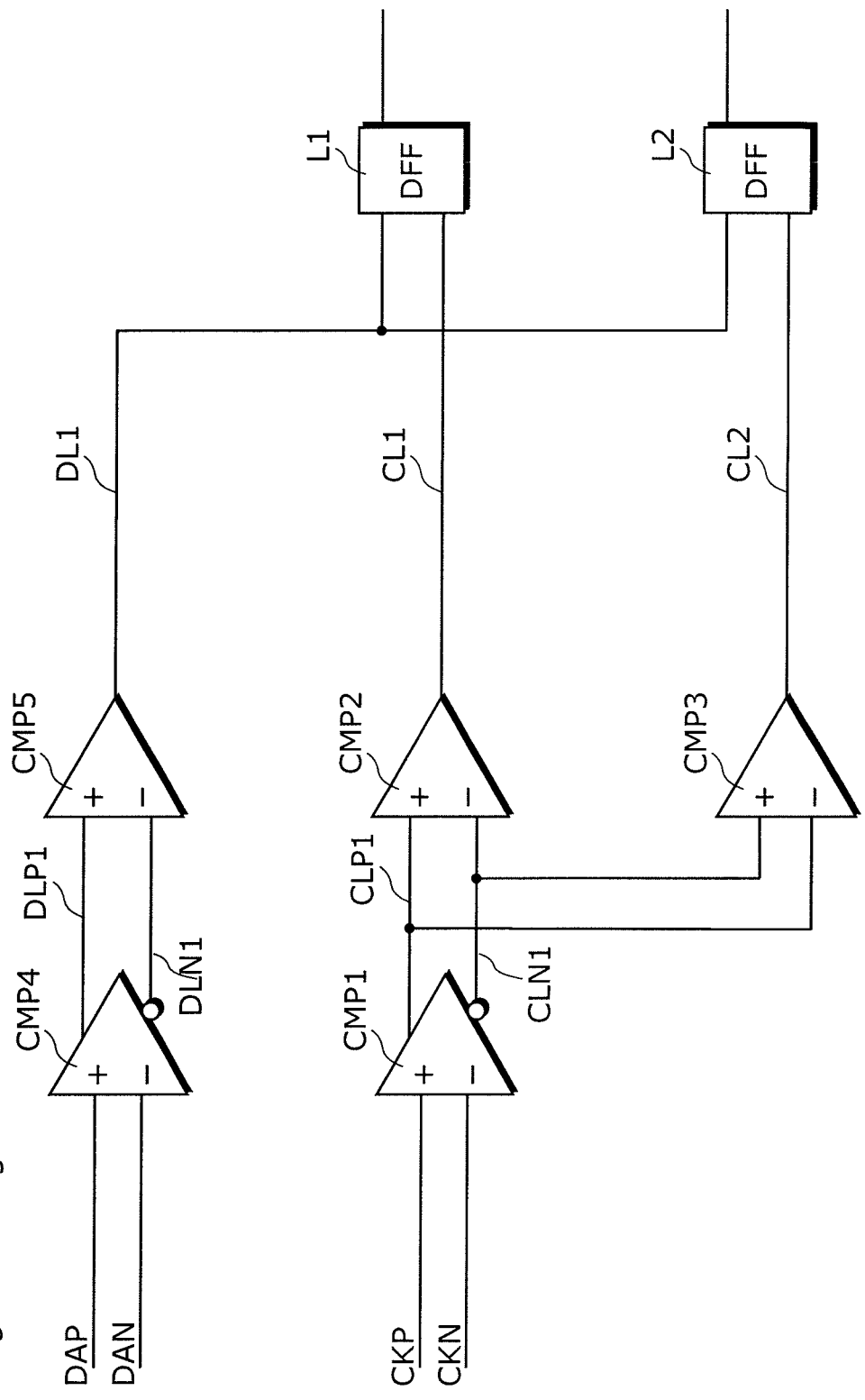
FIG. 1 is a circuit configuration diagram of a data signal loading circuit in a first embodiment of the present invention.

FIG. 1 is a circuit configuration diagram of a data signal loading circuit 10 in a first embodiment of the present invention.

The data signal loading circuit 10 of the present invention shown in FIG. 1 is provided with a comparator CMP1 which receives a clock signal CKP and an reverse-phase signal CKN of the clock signal CKP and which outputs a clock signal CLP1 which is in phase with the clock signal CKP and a clock signal CLN1 having an reverse phase of the clock signal CKP. Furthermore, the data signal loading circuit 10 is provided with: a comparator CMP2 having a non-inverting input terminal which receives the clock signal CLP1 and an inverting input terminal which receives the clock signal CLN1; and a comparator CMP3 having an inverting input terminal which receives the clock signal CLP1 and a non-inverting input terminal which receives the clock signal CLN1. Furthermore, the data signal loading circuit 10 is provided with a comparator CMP4 which receives a data signal DAP and a reverse-phase data signal DAN of the data signal DAP, and which outputs a data signal DLP1 which is in phase with the data signal DAP and a reverse-phase data signal DLN1 having a reverse phase of the data signal DAP. Furthermore, the data signal loading circuit 10 is provided with a comparator CMP5 having a non-inverting input terminal which receives the data signal DLP1 and an inverting input terminal which receives the reverse-phase data signal DLN1. Furthermore, the data signal loading circuit 10 is provided with: a latch circuit L1 which loads a signal DL1 outputted from the comparator CMP 5, in accordance with the signal CL1 outputted from the comparator CMP2; and a latch circuit L2 which loads the signal DL1 outputted from the comparator CMP 5, in accordance with the signal CL2 outputted from the comparator CMP3.

Here, the signals inputted to the comparator CMP1 and the comparator CMP4 shall be described. The clock signal CKP and the reverse-phase signal CKN as well as the data signal DAP and the reverse-phase data signal DAN are inputted as differential signals having a constant amplitude with respect to a reference voltage. As a preferred embodiment, the reference voltage is from 0.3V to −1.0V, and the differential signal amplitude is from ±35 mV to ±600 mV. On the other hand, the power supply potential used within the data signal loading circuit 10 is from 2.0V to 3.6V, and since the amplitude of the differential signals with respect to the power supply potential is small, they are referred to as small-amplitude signals. The reduction of power consumption in signal transmission and low electromagnetic interference (EMI), for example, can be given as advantages of using such a small-amplitude signal.

Hereinafter, the behavior of the small-amplitude signals shall be described based on the configuration shown in FIG. 1.

The signal CL1 outputted from the comparator CMP2 and the signal CL2 outputted from the comparator CMP3 are inputted, as clock signals, to the latch circuits L1 and L2, respectively, which load the signal DL1 outputted from the comparator CMP5. The latch circuits L1 and L2 load the signal DL1 outputted from the comparator CMP5, at the rise and fall of the clock signals CL1 and CL2, respectively.

Figure 2:
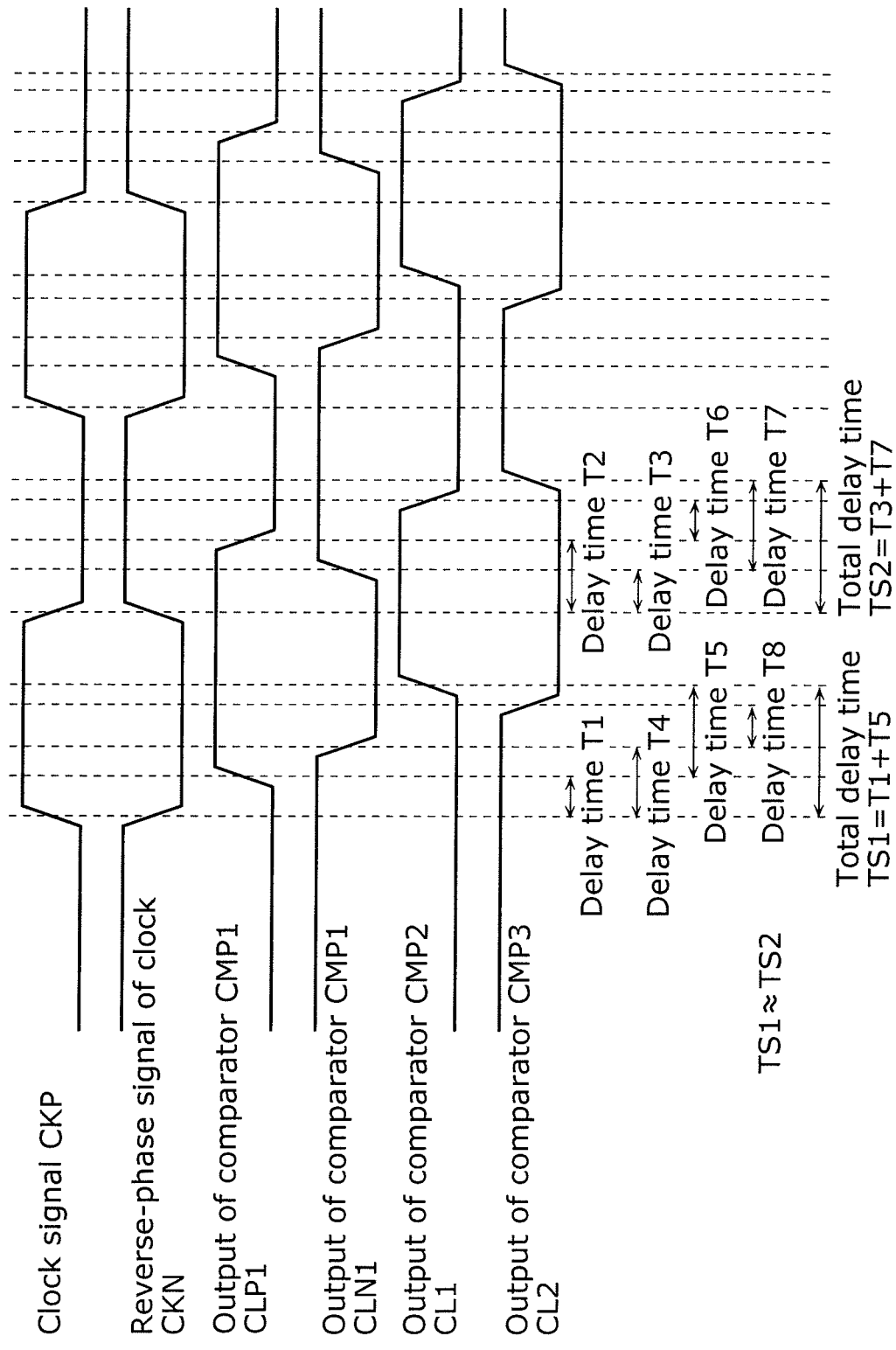
FIG. 2 is a timing chart for the data signal loading circuit in the first embodiment of the present invention.

Here, the behavior of the respective signals in the data signal loading circuit 10 in FIG. 1 shall be described using the timing chart in FIG. 2.

The rise and fall of the output signal CLP1 of the comparator CMP1 are outputted delayed from the rise and fall of the input signal CKP of the comparator CMP1 by a delay time T1 and a delay time T2, respectively. Furthermore, the rise and fall of the output signal CLN1 of the comparator CMP1 are outputted delayed from the rise and fall of the input signal CKN of the comparator CMP1 by a delay time T3 and a delay time T4, respectively. Furthermore, the rise and fall of the output signal CL1 of the comparator CMP2 are outputted delayed from the rise and fall of the input signal CLP1 of the comparator CMP2 by a delay time T5 and a delay time T6, respectively. Furthermore, the rise and fall of the output signal CL2 of the comparator CMP3 are outputted delayed from the rise and fall of the input signal CLN1 of the comparator CMP3 by a delay time T7 and a delay time T8, respectively.

When the circuit configuration of the comparator CMP1 is a fully-differential circuit, the delay time T1 and delay time T3, and the delay time T2 and delay time T4 become approximately equal delay times. In addition, when the comparator CMP2 and the comparator CMP3 have the same circuit configuration, the delay time T5 and delay time T7, and the delay time T6 and delay time T8 become approximately equal delay times. With this, a total delay time TS1 for the rise of the clock signal CL1 inputted to the latch circuit L1 becomes TS1=T1+T5, and a total delay time TS2 for the rise of the clock signal CL2 inputted to the latch circuit L2 becomes TS2=T3+T7, and that, as a result, TS1 and TS2 become approximately equal delay times. Furthermore, in the same manner, the fall total delay times inputted to the latch circuit L1 and the latch circuit L2 also become approximately equal delay times.

In addition, when the latch circuits L1 and L2 have the same circuit configuration, the setup time and the hold time necessary for the data signal loading by the latch circuit itself become equal, and thus even more reliable data signal loading becomes possible. This solves the problem in the conventional data signal loading circuit 100.

Figure 11:
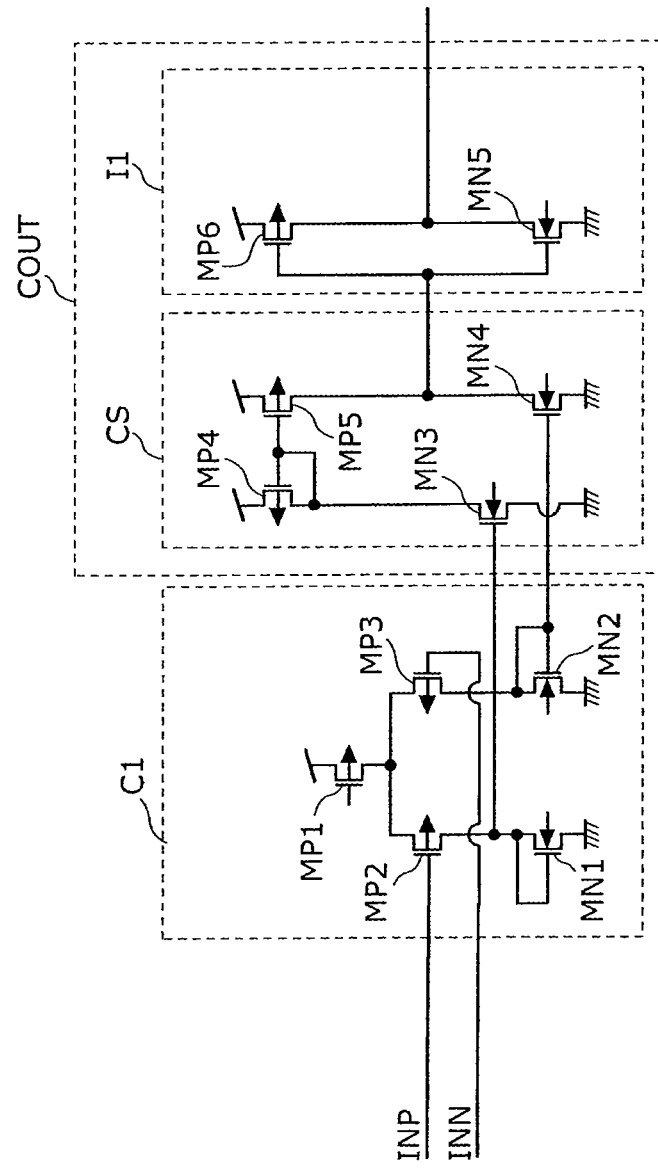
FIG. 11 is a circuit configuration diagram of comparators.

Furthermore, when the configuration of the comparator CMP1 and the comparator CMP4 is switched to that of the comparator C1 shown in FIG. 11, and the configuration of the comparator CMP2, the comparator CMP3, and the comparator CMP5 is switched to that of a comparator COUT which combines the comparator CS and the inverter I1 shown in FIG. 11, power consumption can be suppressed compared to the configuration of the conventional data signal loading circuit 200, since one comparator C1 shown in FIG. 11 becomes unnecessary.

Figure 12:
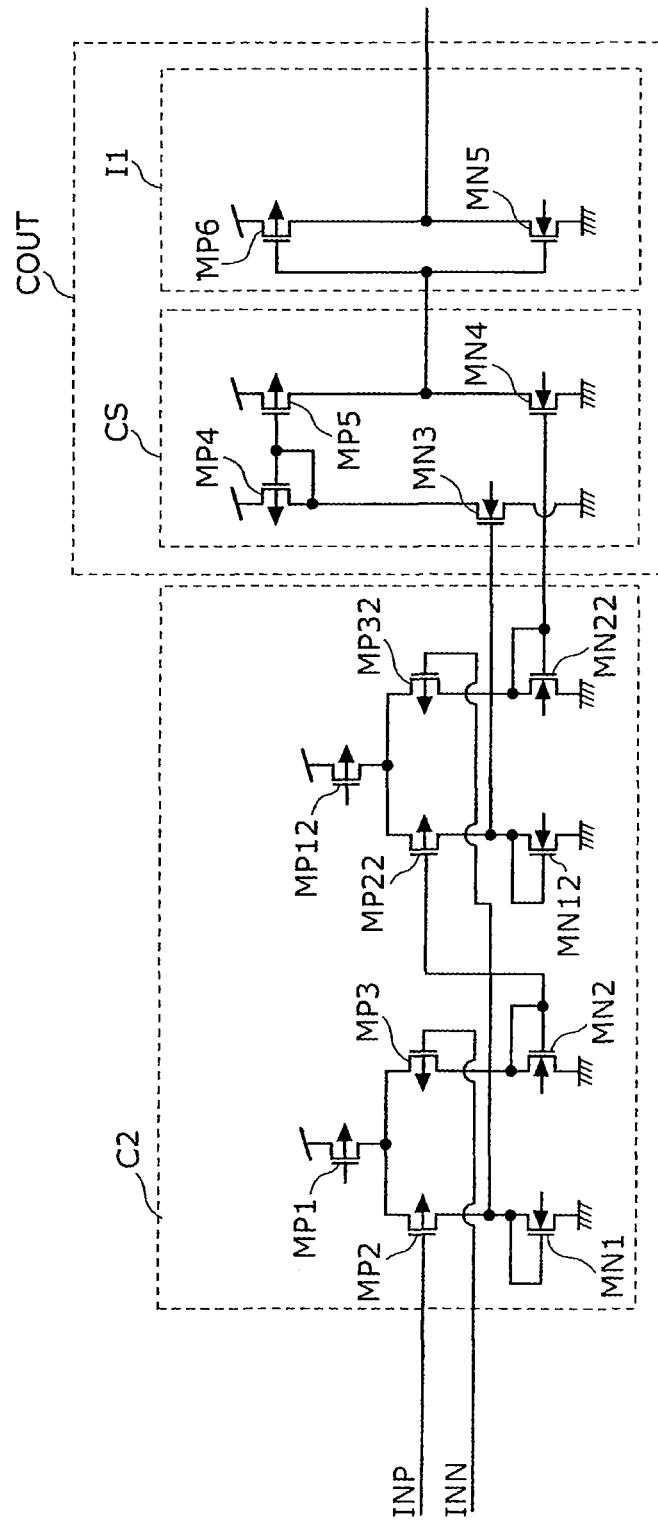
FIG. 12 is a circuit configuration diagram of other comparators.

In addition, when the configuration of the comparator CMP1 and the comparator CMP4 is switched to a configuration in which comparators are connected in multiple stages as in a comparator C2 shown in FIG. 12, power consumption can be further suppressed compared to the configuration of the conventional data signal loading circuit 200.

Furthermore, it is preferable that differential signals to be inputted to the comparator CMP1 and the comparator CMP4 are inputted via a signal quality adjustment circuit. In addition, when the comparator CMP1 and the comparator CMP4 have the same circuit configuration, the comparator CMP1 and the comparator CMP4 can shape waveforms using the same signal quality adjustment circuit.

Furthermore, the signal quality adjustment circuit is intended for signal waveform shaping, such as impedance matching. Therefore, by shaping the signal waveform, impedance matching becomes easier compared to the conventional data signal loading circuit 200, and thus reliable signal transmission and high-speed operation of the data signal loading circuit become possible, and suppression of unnecessary radiation also becomes possible.

Second Embodiment

Figure 3:
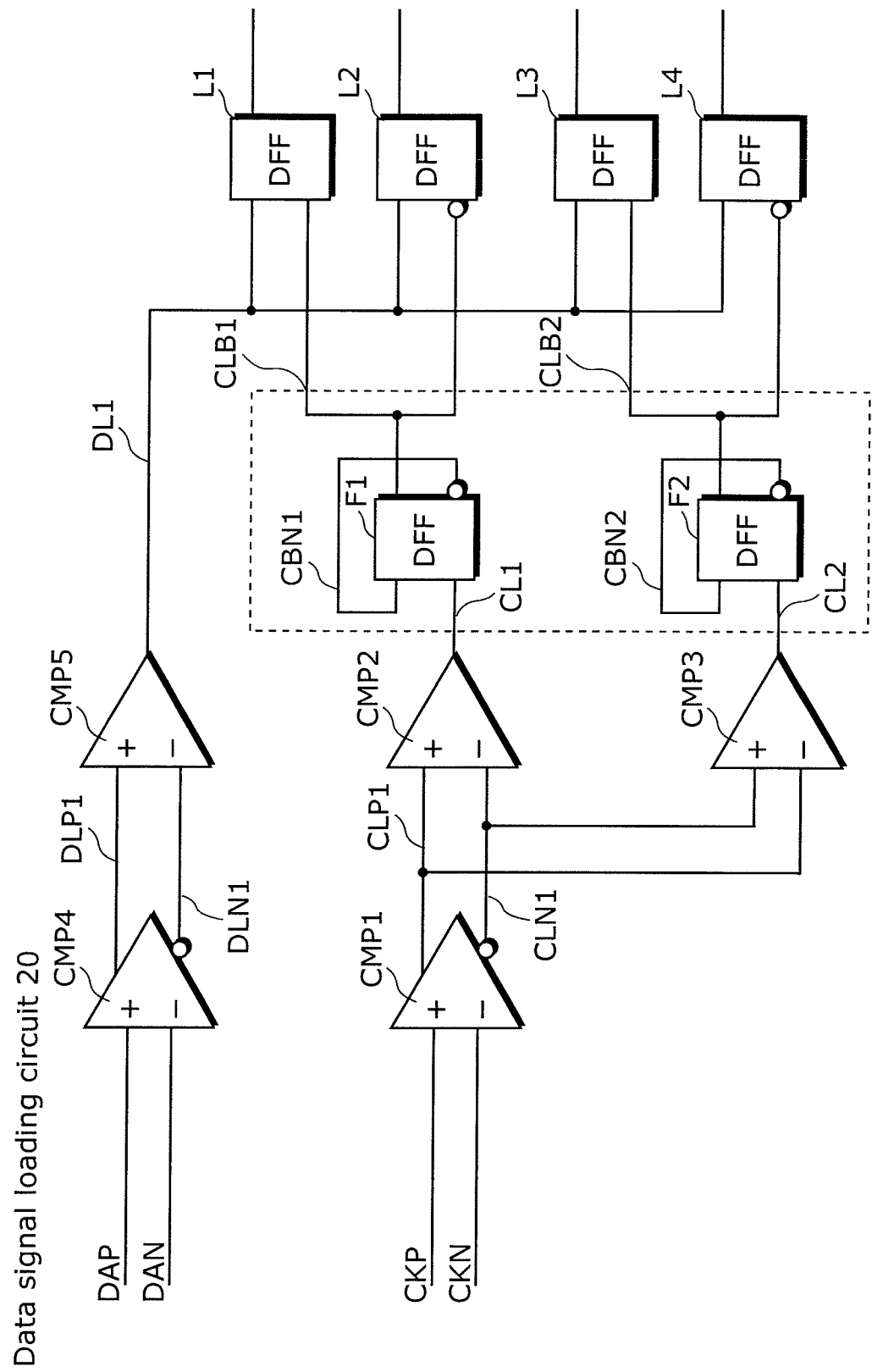
FIG. 3 is a circuit configuration diagram of a data signal loading circuit in a second embodiment of the present invention.

FIG. 3 is a circuit configuration diagram of a data signal loading circuit 20 in a second embodiment of the present invention.

A clock signal CKP and a reverse-phase signal CKN of the clock signal CKP are inputted to the data signal loading circuit 20 of the present invention shown in FIG. 3. Furthermore, the data signal loading circuit 20 is provided with a comparator CMP1 which outputs a clock signal CLP1 which is in phase with the clock signal CKP and a clock signal CLN1 having a reverse phase of the clock signal CKP. Furthermore, the data signal loading circuit 20 is provided with: a comparator CMP2 having a non-inverting input terminal which receives the clock signal CLP1 and an inverting input terminal which receives the clock signal CLN1; and a comparator CMP3 having an inverting input terminal which receives the clock signal CLP1 and a non-inverting input terminal which receives the clock signal CLN1. Furthermore, CLB1 is outputted from a flip-flop circuit F1 which frequency-divides the signal CL1 outputted from the comparator CMP2, and CLB2 is outputted from a flip-flop circuit F2 which frequency-divides the signal CL2 outputted from the comparator CMP3. Furthermore, the data signal loading circuit 20 is provided with a comparator CMP4 which receives a data signal DAP and a reverse-phase data signal DAN of the data signal DAP, and which outputs a data signal DLP1 which is in phase with the data signal DAP and a reverse-phase data signal DLN1 having a reverse phase of the data signal DAP. Furthermore, the data signal loading circuit 20 is provided with a comparator CMP5 having a non-inverting input terminal which receives the data signal DLP1 and an inverting input terminal which receives the reverse-phase data signal DLN1. Furthermore, the data signal loading circuit 20 is provided with a latch circuit L1 and a latch circuit L2 which load a signal DL1 outputted from the comparator CMP 5, at the rise and fall of the signal CLB1 outputted from the flip-flop circuit F1, respectively. Furthermore, the data signal loading circuit 20 is provided with a latch circuit L3 and a latch circuit L4 which load the signal DL1 outputted from the comparator CMP 5, at the rise and fall of the signal CLB2 outputted from the flip-flop circuit F2, respectively.

Figure 4:
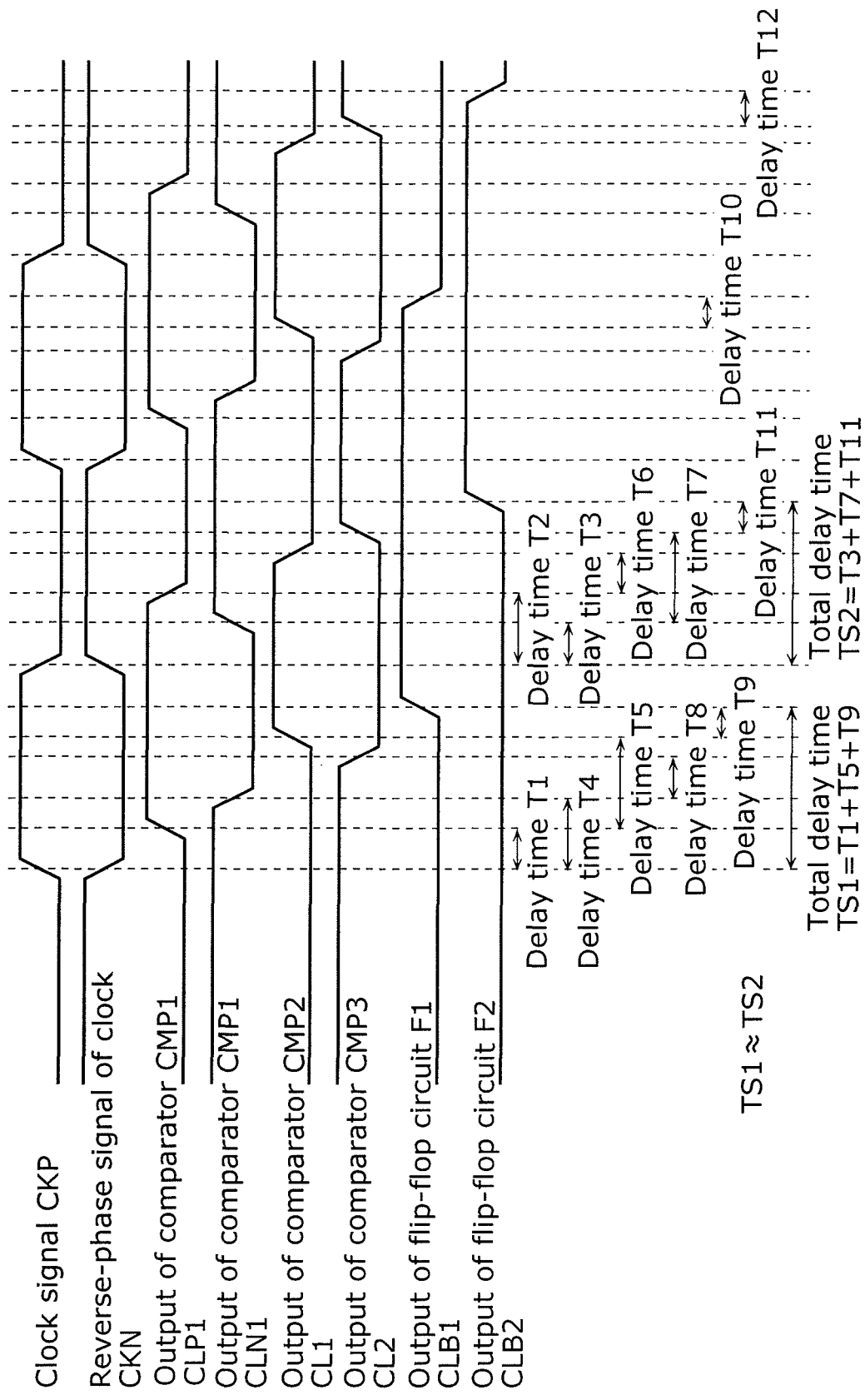
FIG. 4 is a timing chart for the data signal loading circuit in the second embodiment of the present invention.

Here, the behavior of each signal in the data signal loading circuit 20 in FIG. 3 shall be described using the timing chart in FIG. 4.

The rise and fall of the output signal CLP1 of the comparator CMP1 are outputted delayed from the rise and fall of the input signal CKP of the comparator CMP1 by a delay time T1 and a delay time T2, respectively. Furthermore, the rise and fall of the output signal CLN1 of the comparator CMP1 are outputted delayed from the rise and fall of the input signal CKN of the comparator CMP1 by a delay time T3 and a delay time T4, respectively. Furthermore, the rise and fall of the output signal CL1 of the comparator CMP2 are outputted delayed from the rise and fall of the input signal CLP1 of the comparator CMP2 by a delay time T5 and a delay time T6, respectively. Furthermore, the rise and fall of the output signal CL2 of the comparator CMP3 are outputted delayed from the rise and fall of the input signal CLN1 of the comparator CMP3 by a delay time T7 and a delay time T8, respectively. In addition, the rise and fall of the output signal CLB1 of the flip-flop circuit F1 are outputted delayed from the rise and fall of the output signal CL1 of the comparator CMP2 by a delay time T9 and a delay time T10, respectively. Furthermore, the rise and fall of the output signal CLB2 of the flip-flop circuit F2 are outputted delayed from the rise and fall of the output signal CL2 of the comparator CMP3 by a delay time T11 and a delay time T12, respectively.

When the circuit configuration of the comparator CMP1 is a fully-differential circuit, the delay time T1 and delay time T3, and the delay time T2 and delay time T4 become approximately equal delay times. In addition, when the comparator CMP2 and the comparator CMP3 have the same circuit configuration, the delay time T5 and delay time T7, and the delay time T6 and delay time T8 become approximately equal delay times. Furthermore, when the flip-flop circuit F1 and the flip-flop circuit F2 have the same circuit configuration, the delay time T9 and the delay time T11, and the delay time T10 and the delay time T12 become approximately equal delay times. With this, a total delay time TS1 for the rise of the clock signal CLB1 inputted to the latch circuit L1 becomes TS1=T1+T5+T9, and a total delay time TS2 for the rise of the clock signal CLB2 inputted to the latch circuit L3 becomes TS2=T3+T7+T11, and that, as a result, TS1 and TS2 become approximately equal delay times. Furthermore, when transistor size adjustment is performed to match the rise and fall delay times of the flip-flop circuits F1 and F2, the delay times from the delay time T9 to the delay time T12 become approximately equal delay times. With this, the total delay time for the fall of the clock signal CLB1 inputted to the latch circuit L2 becomes a delay time approximately equal to TS1, and the total delay time for the fall of the clock signal CLB2 inputted to the latch circuit L4 becomes a delay time approximately equal to TS2.

By adopting such a configuration, the operating cycle for the signals outputted from the latch circuits of the data signal loading circuit 20 becomes half compared to the operating cycle of the signals outputted from the latch circuits of the data signal loading circuit 10. As such, when loading at a central timing in the operating cycle of a signal outputted from a latch circuit is desired, timing margins, such as setup and hold, double as a result, and thus the operating frequencies of the clock signal and the reverse-phase signal of the clock signal, and the data signal and the reverse-phase data signal having the reverse phase of the data signal can be increased, and thus high-speed operation becomes possible.

It should be noted that although, in the data signal loading circuit 20, the output signal CL1 of the comparator CMP2 and the output signal CL2 of the comparator CMP3 are inputted to the latch circuits being frequency-divided by two, frequency-division by more than two may also be performed.

In addition, since flip-flop circuits are provided in the clock input lines of the latch circuits and their delay times do not match that of the output signal DL1 from the comparator CMP5, it is preferable to provide a delay adjustment circuit for the output signal DL1 from the comparator CMP5.

Figure 5:
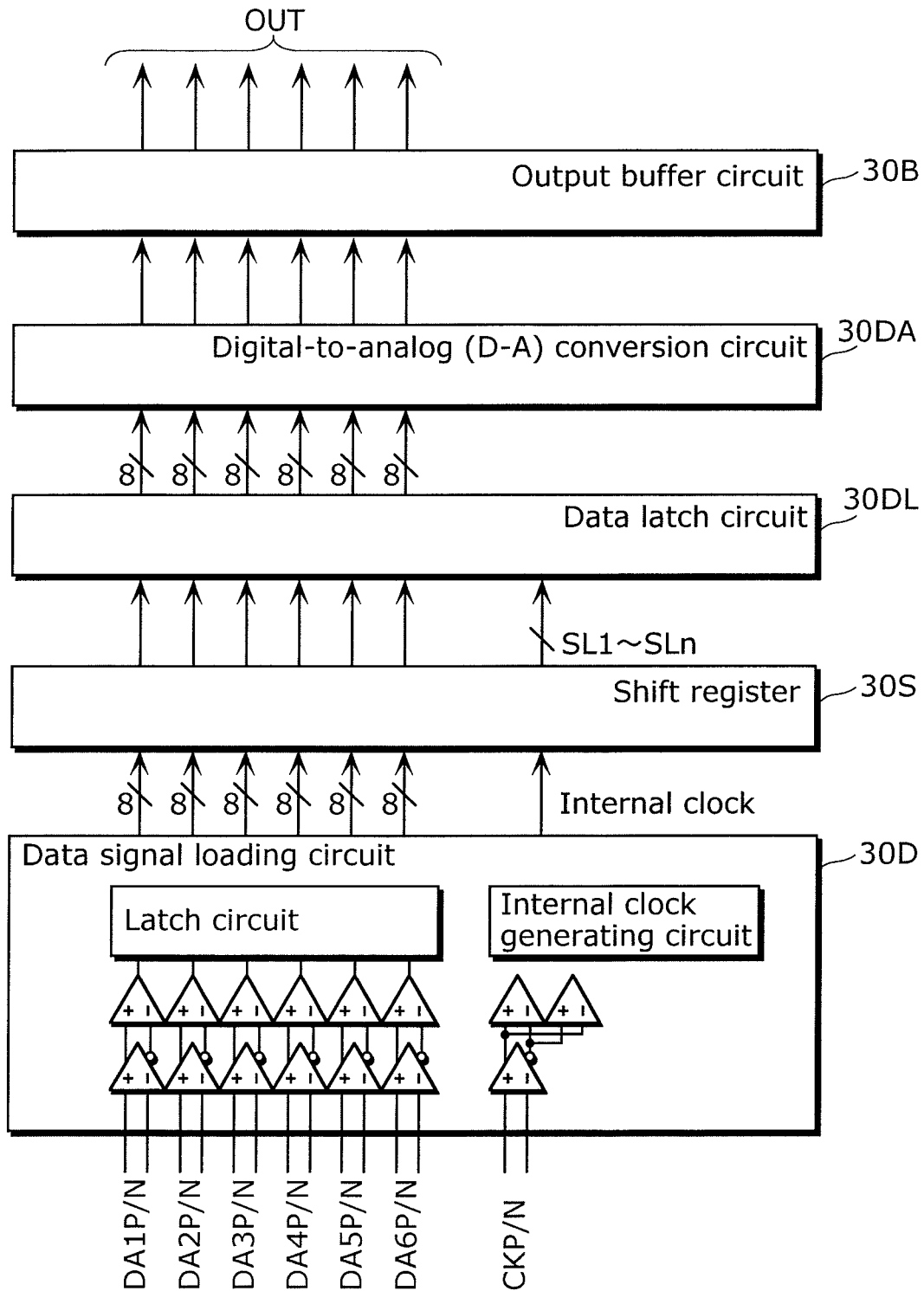
FIG. 5 is a circuit configuration diagram of a display panel driving circuit in an aspect of the present invention.

Next, an example of the configuration of a common-configuration display panel driving circuit 30 shall be described using FIG. 5.

FIG. 5 is a block diagram showing the configuration of the display panel driving circuit 30 according to an aspect of the present invention. The display panel driving circuit 30 includes: (i) a data signal loading circuit 30D including data comparators and clock comparators which receive small-amplitude differential display data signals and clock signals, respectively, an internal clock generating circuit which generates an internal clock signal according to output signals from the clock comparators, and a latch circuit for latching display data signals outputted from the data comparators; (ii) a shift register 30S which sequentially generates latch signals SL1 to SLn in accordance with the internal clock signal outputted from the data signal loading circuit 30D; (iii) a data latching circuit 30DL which loads display data signals outputted from the data signal loading circuit 30D, in accordance with the latch signals outputted from the shift register 30S; (iv) a digital-to-analog (D-A) conversion circuit 30DA which converts digital display data signals outputted from the data latch circuit 30DL into analog signals; and (v) an output buffer circuit 30B for outputting signals outputted from the D-A conversion circuit 30DA, to a display panel.

The data signal loading circuit 30D includes the configurations of the data signal loading circuits according to the present invention, shown in FIG. 1 and FIG. 3, and can implement reliable data signal transmission and data signal loading at high speed, as well as low power consumption.

It should be noted that although the digital power supply voltage supplied to the data signal loading circuit 30D, the shift register 30S, and the data latch circuit 30DL included in the display panel driving circuit 30 in FIG. 5 are normally the same, the comparators in the data signal loading circuit 30D may be supplied with a digital power supply voltage that is different to the digital power supply voltage supplied to other circuits.

Although the lowering of power supply voltage leads to low power consumption, this is not suited to high-speed operation since the input voltage range of circuits such as comparators becomes narrow, and the current capability of transistors deteriorates. As such, by raising only the power supply voltage supplied to comparators for which high speed operation is required, high-speed data signal loading while preventing a significant increase in power consumption becomes possible.

Furthermore, when high-speed operation is not required, the power supply voltage to the comparators can also be lowered in order to reduce unnecessary consumption current.

It should be noted that, although supplying a different digital power supply voltage only to the comparators has been described above, the different digital power supply voltage may also be supplied to other logic circuits for which high-speed operation is required.

Figure 6:
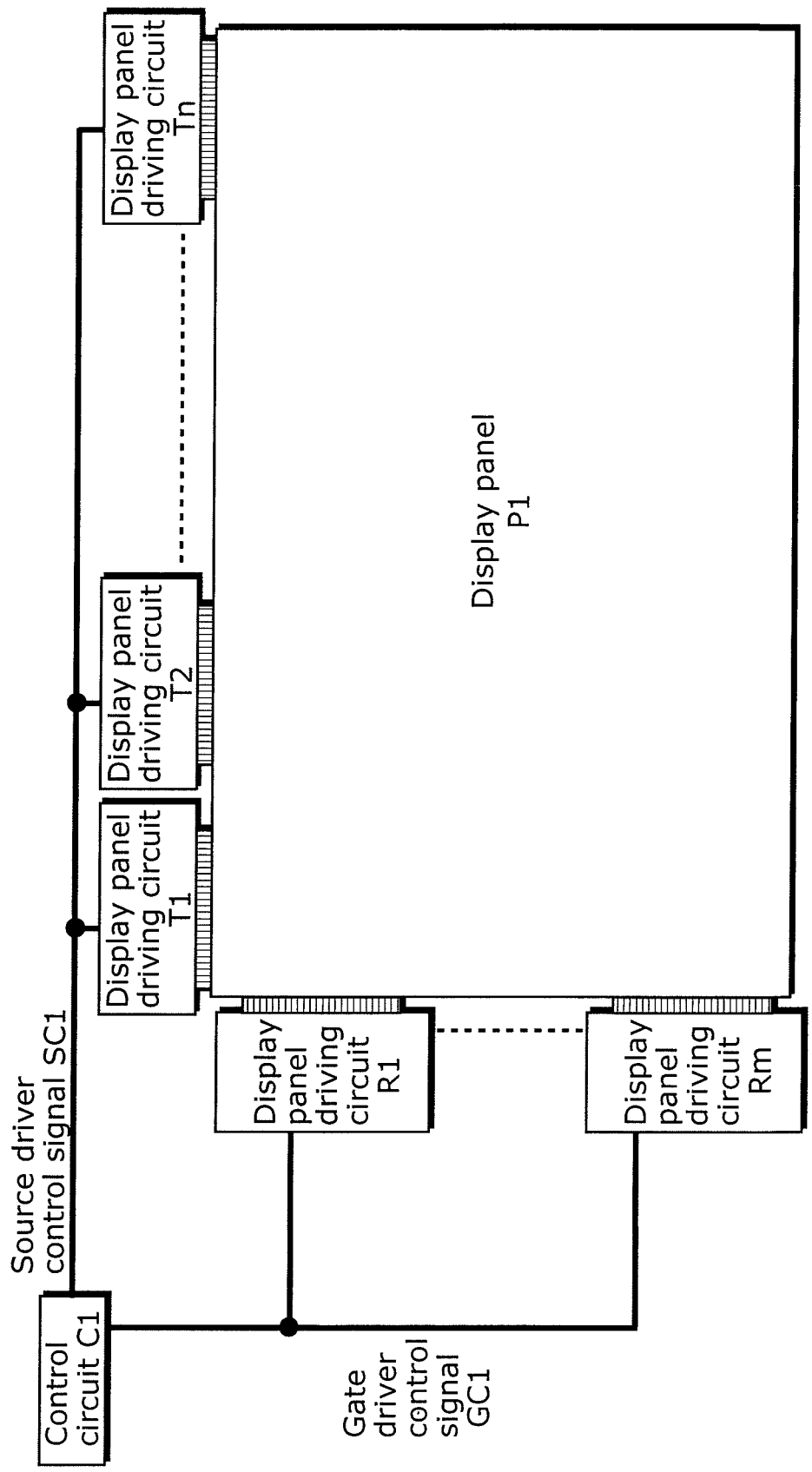
FIG. 6 is a circuit configuration diagram of an image display apparatus in an aspect of the present invention.
Figure 7:
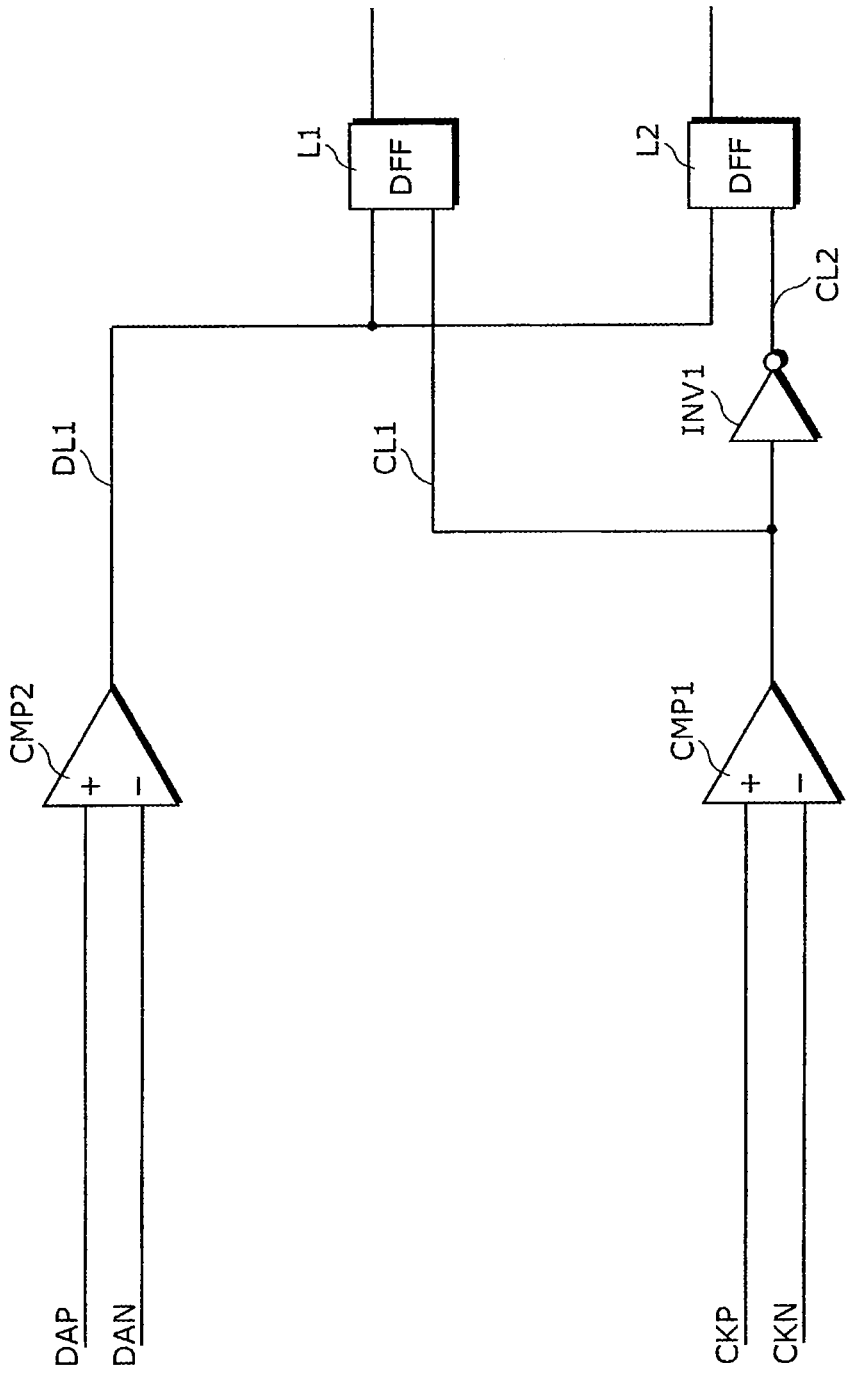
FIG. 7 is a circuit configuration diagram of a conventional data signal loading circuit.
Figure 8:
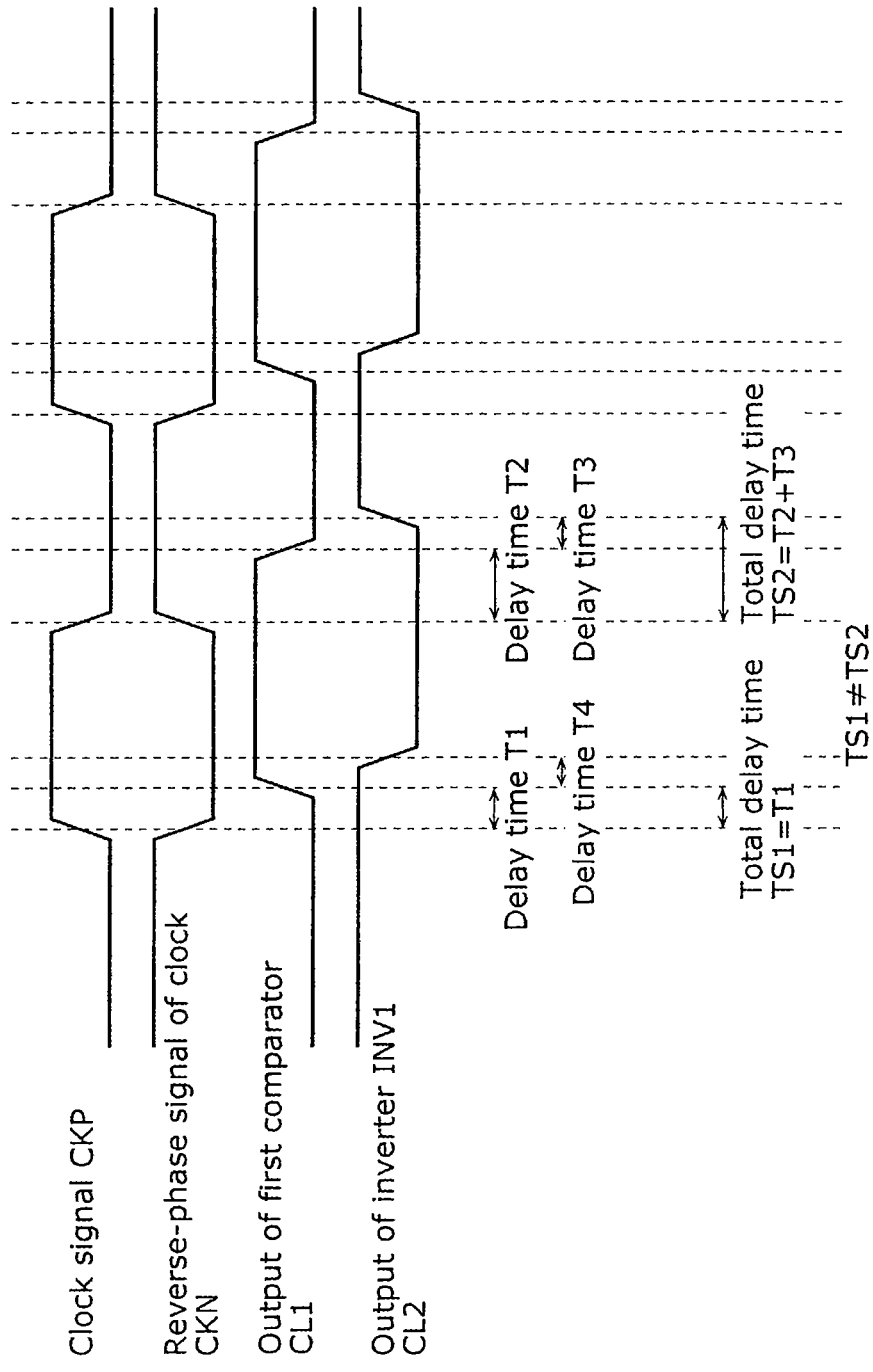
FIG. 8 is a timing chart for the conventional data signal loading circuit.
Figure 9:
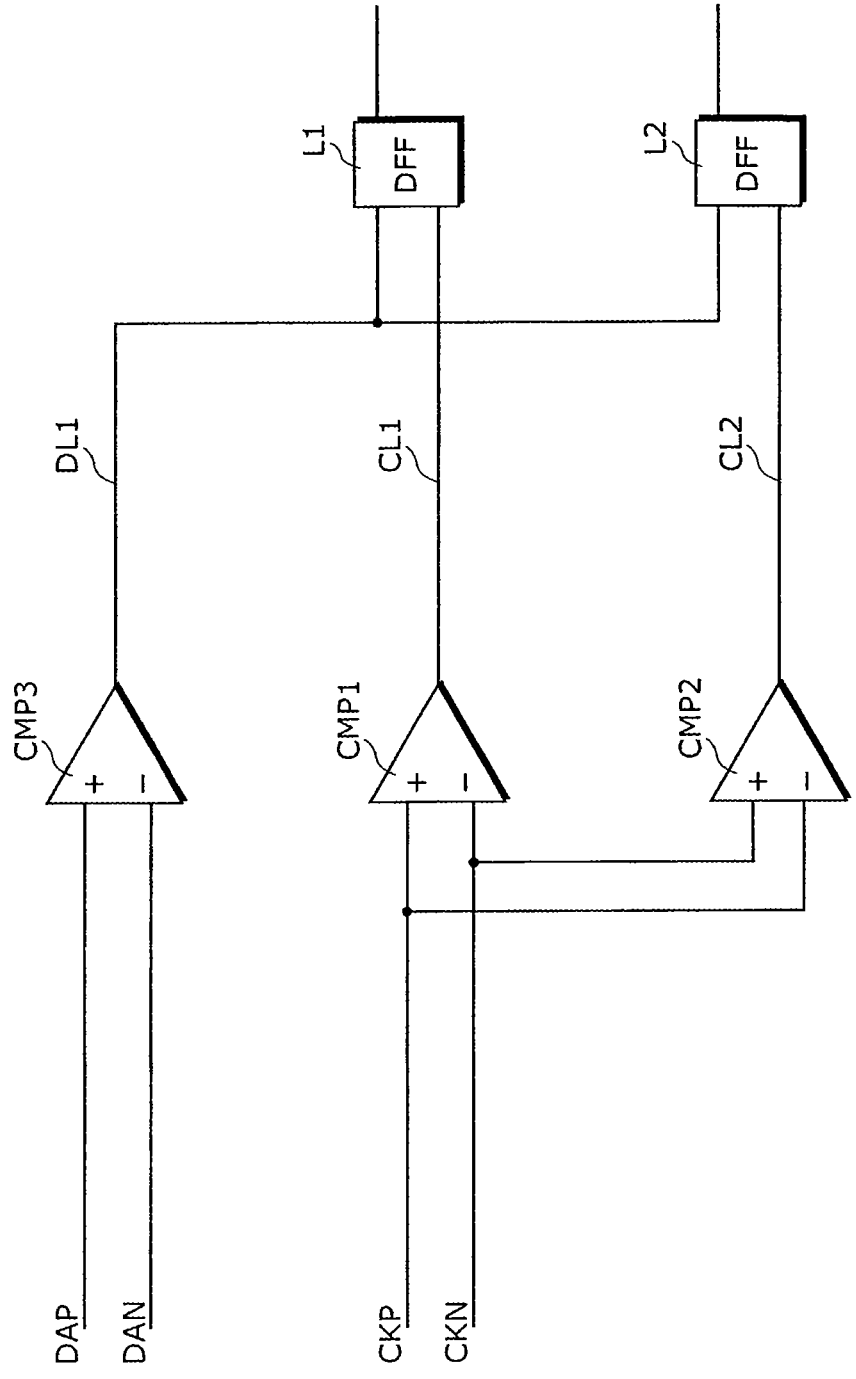
FIG. 9 is a circuit configuration diagram of another conventional data signal loading circuit.
Figure 10:
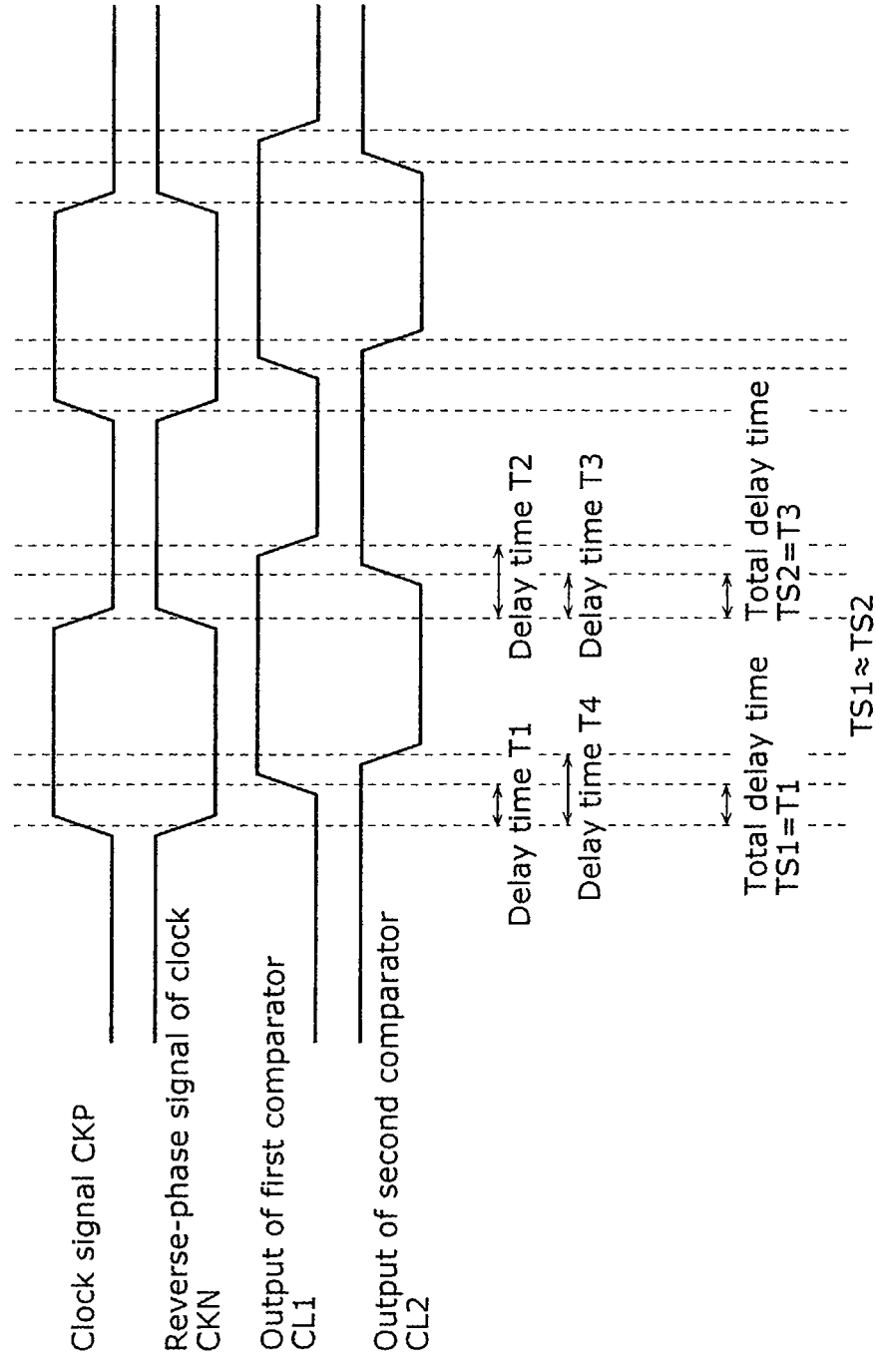
FIG. 10 is a timing chart for the conventional data signal loading circuit.

Next, an example of the configuration of a common-configuration image display apparatus 40 shall be described using FIG. 6.

FIG. 6 is a block diagram showing the configuration of the image display apparatus 40 which includes a-plurality of the display panel driving circuits 30 shown in FIG. 5, according to an aspect of the present invention. The image display apparatus 40 shown in FIG. 6 includes: a liquid crystal display panel P1 made up of plural image display elements (not shown); display panel diving circuits T1, T2, . . . , and Tn (generally referred to as source drivers) each for supplying gradation voltage; display panel driving circuits R1, R2, . . . , and Rm (generally referred to as gate drivers) each for outputting a signal that scans the horizontal direction of the liquid crystal display panel P1; and a control circuit C1 for outputting signals for controlling the display panel driving circuits T1, T2, . . . , and Tn and the display panel driving circuits R1, R2, . . . , and Rm (where n and m are positive integers greater than 2).

Here, each of the display panel driving circuits T1, T2, . . . , and Tn corresponds to the display panel driving circuit 30 shown in FIG. 5.

High-definition and large screens are highly demanded from the latest liquid crystal display panels, and thus the speeding-up of data signal loading circuits is required in order to satisfy such requirements. Adopting a configuration as shown in FIG. 6 makes it possible to satisfy such requirements.

Furthermore, although the liquid crystal display panel P1, the display panel diving circuits T1, T2, . . . , and Tn, the display panel driving circuits R1, R2, . . . , and Rm, and the control circuit C1 are separated from each other when adopting a configuration such as that of the image display apparatus 40 shown in FIG. 6, the image display apparatus 40 may be configured by integrating all of these constituent elements, or aggregable blocks thereof.

By adopting such a configuration, it is possible to reduce the space and materials cost for installing the display panel diving circuits T1, T2, . . . , and Tn, the display panel driving circuits R1, R2, . . . , and Rm, and the control circuit C1, and thus costs can be reduced. Furthermore, with the reduction in the number of components to be used, a reliable image display apparatus can be realized.

In addition, although the image display apparatus including the display panel driving circuit according to the present invention is described in a configuration which uses a liquid crystal display panel, the display panel driving circuit according to the present invention can be applied to various display panels other than a liquid crystal display panel, such as a plasma display panel (PDP), an organic light emitting display panel, and an inorganic light emitting display panel.

Although the data signal loading circuit, the display panel driving circuit, and the image display apparatus of the present invention have been described based on the aforementioned exemplary embodiments, the present invention is not limited to such. Various modifications of the exemplary embodiments as well as embodiments resulting from arbitrary combinations of constituent elements of the different exemplary embodiments that may be conceived by those skilled in the art are intended to be included within the scope of the present invention as long as these do not depart from the essence of the present invention.

INDUSTRIAL APPLICABILITY

The data signal loading circuit of the present invention can perform the data signal loading in the latch circuits steadily even when there is a deviation in the duty ratio between the high interval and the low interval in the output of comparators which receive differential signals, and is particularly useful in display panel driving circuits for driving an image display apparatus, such as a liquid crystal display apparatus, at high-speed and with low power consumption.

What is claimed is:

1. A data signal loading circuit comprising:
a first comparator which receives a first clock signal and a reverse-phase signal of the first clock signal, and outputs a second clock signal and a second reverse-phase clock signal, the second clock signal being in phase with the first clock signal, and the second reverse-phase clock signal having a reverse phase of the first clock signal;
a second comparator having a non-inverting input terminal which receives the second clock signal and an inverting input terminal which receives the second reverse-phase clock signal;
a third comparator having an inverting input terminal which receives the second clock signal and a non-inverting input terminal which receives the second reverse-phase signal;
a fourth comparator which receives a data signal and a reverse-phase data signal having a reverse phase of the data signal, and which outputs a second data signal and a second reverse-phase data signal, the second data signal being in phase with the data signal, and the second reverse-phase data signal having a reverse phase of the data signal;
a fifth comparator having a non-inverting input terminal which receives the second data signal and an inverting input terminal which receives the second reverse-phase data signal;
a first latch circuit which loads a signal outputted from said fifth comparator, in accordance with a signal outputted from said second comparator; and
a second latch circuit which loads the signal outputted from said fifth comparator, in accordance with a signal outputted from said third comparator.

2. The data signal loading circuit according to claim 1, wherein said first comparator and said fourth comparator are fully-differential circuits.

3. The data signal loading circuit according to claim 1, wherein said second comparator and said third comparator have the same circuit configuration.

4. The data signal loading circuit according to claim 1, wherein said first latch circuit and said second latch circuit have the same circuit configuration and uniformly load the signal outputted from said fifth comparator, at a rise or a fall of the signal outputted from the second comparator and the signal outputted from the third comparator.

5. The data signal loading circuit according to claim 1, wherein voltage of the first clock signal, the reverse-phase signal of the first clock signal, the data signal, and the reverse-phase data signal is smaller than a potential difference between a power supply potential and a ground potential of said data signal loading circuit.

6. The data signal loading circuit according to claim 1, wherein said first comparator and said fourth comparator have the same circuit configuration.

7. The data signal loading circuit according to claim 1, wherein said first latch circuit includes a third latch circuit and a fourth latch circuit which load the signal outputted from said fifth comparator,
said second latch circuit includes a fifth latch circuit and a sixth latch circuit which load the signal outputted from said fifth comparator,
said data signal loading circuit further comprises:
a first flip-flop circuit which frequency-divides the signal outputted from said second comparator; and
a second flip-flop circuit which frequency-divides the signal outputted from said third comparator,
said third latch circuit loads the signal outputted from said fifth comparator, at a rise of a third clock signal outputted from said first flip-flop circuit,
said fourth latch circuit loads the signal outputted from said fifth comparator, at a fall of the third clock signal,
said fifth latch circuit loads the signal outputted from said fifth comparator, at a rise of a fourth clock signal outputted from said second flip-flop circuit, and
said sixth latch circuit loads the signal outputted from said fifth comparator, at a fall of the fourth clock signal.

8. The data signal loading circuit according to claim 1, wherein the first clock signal and the reverse-phase signal of the first clock signal are inputted to said first comparator via a signal quality adjustment circuit, and
the data signal and the reverse-phase data signal are inputted to the fourth comparator via a signal quality adjustment circuit.

9. A display panel driving circuit comprising:
said data signal loading circuit according to claim 1, which receives a display data signal and the first clock signal, and loads the display data signal;
a shift register which generates a latch signal for sequentially loading display data signals outputted from said data signal loading circuit; and
a digital-to-analog (D-A) conversion circuit which converts a digital signal outputted from said data signal loading circuit into an analog signal.

10. The display panel driving circuit according to claim 9, wherein a power supply potential supplied to said first to fifth comparators is different from a power supply potential supplied to other than said first to fifth comparators.

11. The display panel driving circuit according to claim 9, wherein a power supply potential supplied to said first to fifth comparators and said first and second latch circuits is different from a power supply potential supplied to other than said first to fifth comparators and said first and second latch circuits.

12. A display panel driving circuit, comprising:
said data signal loading circuit according to claim 7, which receives a display data signal and the first clock signal, and loads the display data signal;
a shift register which generates a latch signal for sequentially loading display data signals outputted from said data signal loading circuit; and
a digital-to-analog (D-A) conversion circuit which converts a digital signal outputted from said data signal loading circuit into an analog signal,
wherein a power supply potential supplied to said first to fifth comparators, said first and second flip-flop circuits, and said first and second latch circuits is different from a power supply potential supplied to other than said first to fifth comparators, said first and second flip-flop circuits, and said first and second latch circuits.

13. An image display apparatus comprising:
a display panel including image display elements;
said display panel driving circuit according to claim 9, for driving said display panel; and
a control circuit for controlling said display panel driving circuit.

14. The image display apparatus according to claim 13, wherein said display panel is a liquid crystal display panel.

15. The image display apparatus according to claim 13, wherein said display panel, said display panel driving circuit, and said control circuit are integrally formed on a same substrate.

\* \* \* \* \*